United States Patent [19]
Senoo et al.

[11] Patent Number: 5,557,574
[45] Date of Patent: Sep. 17, 1996

[54] SEMICONDUCTOR MEMORY DEVICE WITH FUNCTION OF CARRYING OUT LOGIC JUDGEMENT FOR CORRECT RECOGNITION OF MEMORY OPERATION

[75] Inventors: Yukihiro Senoo, Satsuma-gun; Masao Nakano, Kawasaki, both of Japan

[73] Assignee: Fujitsu Limited, Kawasaki, Japan

[21] Appl. No.: 489,764

[22] Filed: Jun. 13, 1995

[30] Foreign Application Priority Data

Sep. 1, 1994 [JP] Japan .................................. 6-208711

[51] Int. Cl.$^6$ ................................................ G11C 13/00
[52] U.S. Cl. ................ 365/201; 365/189.07; 365/230.06
[58] Field of Search ............................ 365/201, 230.06, 365/189.07; 371/21.1, 21.2

[56] References Cited

U.S. PATENT DOCUMENTS 5,148,398  9/1992  Kohno ..................................... 365/201
5,313,424  5/1994  Adams .................................... 365/201

Primary Examiner—A. Zarabian
Attorney, Agent, or Firm—Armstrong, Westerman, Hattori, McLeland & Naughton

[57] ABSTRACT

A semiconductor memory device includes: a memory cell array having a plurality of word lines; a decoder circuit for decoding an address signal to thereby generate a word line activation signal for driving a corresponding one of the plurality of word lines; a data compression circuit for carrying out a comparison between each data bit, read from the memory cell array in a test mode, of a plurality of memory cells connected to an identical word line, and compressing the result of the comparison to thereby output a logic judgement result; and an output control circuit responsive to an external test mode activation signal and the word line activation signal from the decoder circuit, for controlling the data compression circuit to output the logic judgement result based on the comparison result. When the logic judgement result of the data compression circuit indicates coincidence where the word line activation signal is not output from the decoder circuit, the output control circuit controls the logic judgement result to indicate non-coincidence. It is thus possible to correctly carry out a logic judgement for recognition of whether or not the memory can carry out a normal operation. It is also possible to reduce the test time for the memory device.

11 Claims, 6 Drawing Sheets

SEMICONDUCTOR MEMORY DEVICE WITH FUNCTION OF CARRYING OUT LOGIC JUDGEMENT FOR CORRECT RECOGNITION OF MEMORY OPERATION

BACKGROUND OF THE INVENTION

1. Field of the Invention

This invention relates to a semiconductor memory device, more particularly, to a static random access memory (SRAM) device or a dynamic random access memory (DRAM) device with a bit-compression test mode function to reduce a test time thereof.

2. Description of the Related Art

Conventionally, a typical SRAM or DRAM device includes a data compression circuit for the purpose of reducing the test time thereof. Such a data compression circuit carries out a comparison between each data bit read from corresponding memory cells, in a test mode, and compresses and outputs the result of the comparison. In this case, the respective data bits to be fed to the data compression circuit in the test mode have the same logic level as each other, and are read from a plurality of memory cells connected to a corresponding word line, based on a word line activation signal, for driving the word line, which is generated by decoding an address signal.

For example, referring to the constitution shown in FIG. 3 which is not a prior art, a data compression circuit indicated by reference 17 carries out a comparison between each bit data $D_1, D_2, D_3, \ldots$, read from corresponding memory cells in the test mode, and compresses a result of the comparison to thereby output a logic judgement result at node N thereof. In this case, a signal appearing at node N when the respective bit data $D_1, D_2, D_3, \ldots$, coincide with each other (i.e., when each bit data is at the same logic level), and a signal appearing at node N when the respective bit data do not coincide with each other, exhibit logic levels different from each other.

When the memory functions normally, and where a word line activation signal is generated for driving a corresponding word line, respective data bits fed to the data compression circuit in the test mode, i.e., each data bit read from memory cells connected to an identical word line, have the same logic level as each other, as stated above. Accordingly, the logic judgement result of the data compression circuit indicates "coincidence". In this case, by outputting the logic judgement result indicating the coincidence to the outside of the memory device, it is possible to recognize that the memory can carry out a normal operation.

On the other hand, where there are some defects present in memory cells connected to an identical word line, and when a corresponding word line activation signal is generated, each data bit read from the memory cells connected to the word line in the test mode cannot have the same logic level as each other. Accordingly, the logic judgement result of the data compression circuit indicates "non-coincidence". In this case, based on the logic judgement result indicating non-coincidence, it is possible to recognize that the memory cannot carry out a normal operation.

In the prior art, however, where a word line activation signal is not generated due to some defect or erroneous operation of the peripheral circuits in the test mode, a problem occurs in that, although the memory does not carry out a normal operation, respective data bits read from memory cells connected to an identical word line coincide in level with each other, and accordingly, a logic judgement result of the data compression circuit indicates "coincidence".

Thus, the prior art poses problem in that, based on the logic judgement result indicating the "coincidence" generated by the memory device, an erroneous recognition that the memory can carry out a normal operation is made.

SUMMARY OF THE INVENTION

An object of the present invention is to provide a semiconductor memory device by which it is possible to correctly carry out a logic judgement for recognition of whether or not the memory can carry out a normal operation, and by which it is possible to reduce the test time thereof.

According to the present invention, there is provided a semiconductor memory device including: a memory cell array having a plurality of word lines; a decoder circuit for decoding an address signal to thereby generate a word line activation signal for driving a corresponding one of the plurality of word lines; a data compression circuit for carrying out a comparison between each bit data, read from the memory cell array in a test mode, of a plurality of memory cells connected to an identical word line, and compressing a result of the comparison to thereby output a logic judgement result; and an output control circuit responsive to an external test mode activation signal and the word line activation signal from the decoder circuit, for controlling the data compression circuit to output the logic judgement result based on the comparison result; the output control circuit controlling the logic judgement result of the data compression circuit to indicate non-coincidence when the logic judgement result indicates coincidence where the word line activation signal is not output from the decoder circuit.

BRIEF DESCRIPTION OF THE DRAWINGS

Other objects and features of the present invention will be described hereinafter in detail by way of preferred embodiments with reference to the accompanying drawings, in which.

DESCRIPTION OF THE PREFERRED EMBODIMENTS

Figure 1:
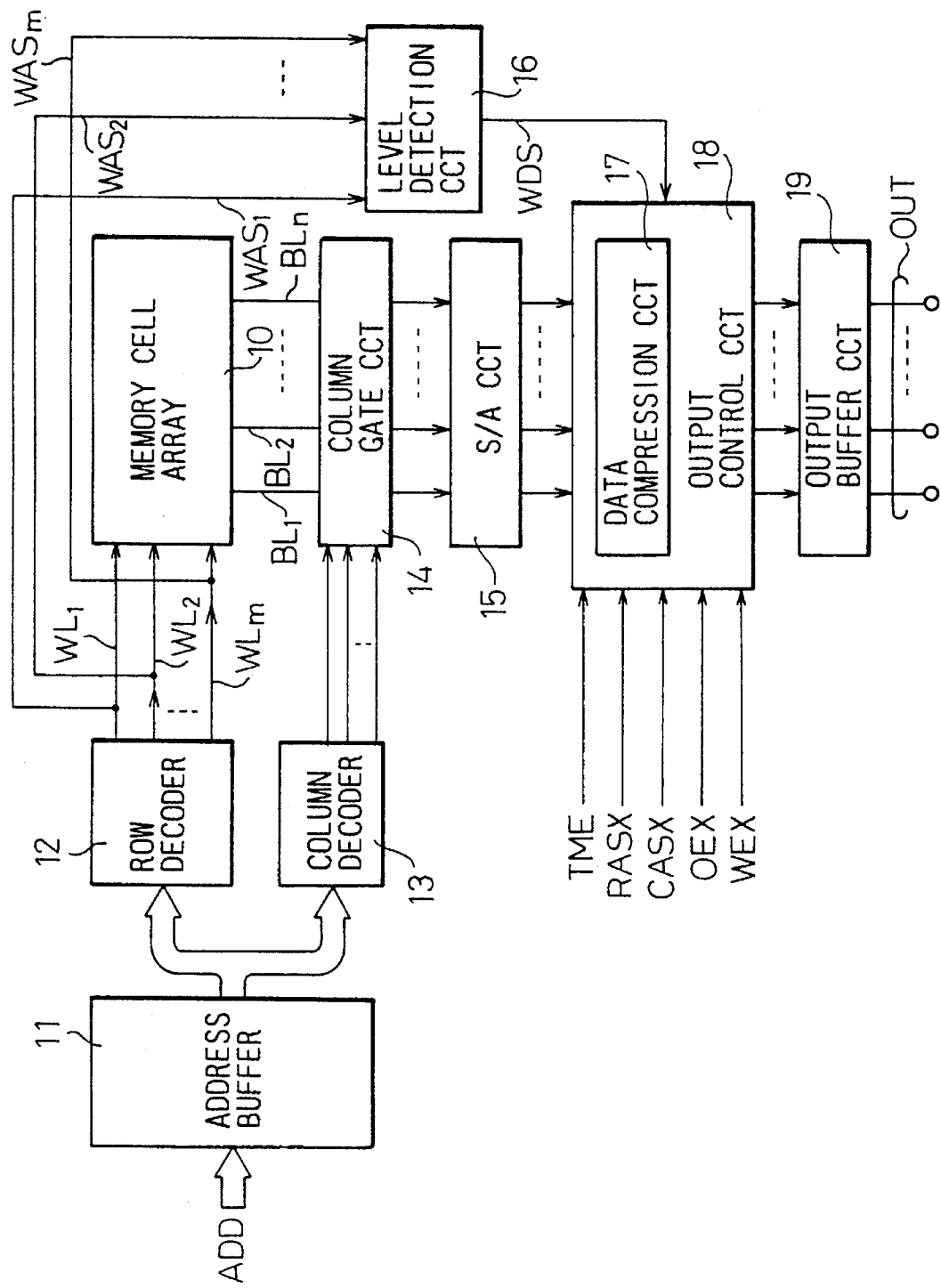
FIG. 1 is a block diagram showing a constitution of the semiconductor memory device adapted to each embodiment according to the present invention.

FIG. 1 schematically illustrates a constitution of the semiconductor memory device adapted to each embodiment according to the present invention.

The illustrated device is directed to a memory (SRAM or DRAM) with a bit-compression test mode function to reduce the test time thereof. For simplification of the description, the illustrated constitution shows only a constitution of the data-reading portion.

In the illustration, reference 10 denotes a memory cell array having a memory cell (not shown) provided at each intersection between a plurality of word lines $WL_1$ to WLm and a plurality of bit lines $BL_1$ to BLn; reference 11 an address buffer for effecting a buffering of an external address signal ADD; reference 12 a row decoder for decoding a row address signal fed from the address buffer 11 to thereby select one of the word lines $WL_1$ to WLm (i.e., to generate word line activation signals $WAS_1$ to WASm); reference 13 a column decoder for decoding a column address signal fed from the address buffer 11 to thereby select one of the bit lines $BL_1$ to BLn; reference 14 a column gate circuit for connecting a selected bit line to a data line in a corresponding column; reference 15 a sense amplifier (S/A) circuit for sensing and amplifying data read out to each data line; and reference 16 a level detection circuit for detecting each logic level of the word line activation signals $WAS_1$ to WASm generated by the row decoder 12 to thereby generate a word line detection signal WDS.

Also, reference 17 denotes a data compression circuit, which carries out a comparison between each data bit, read from the memory cell array 10 in a test mode, of n memory cells connected to an identical word line, and compresses a result of the comparison to thereby output a logic judgement result.

Reference 18 denotes an output control circuit, which is responsive to the word line detection signal WDS fed from the level detection circuit 16 and various control signals (a test mode activation signal TME, an active-low row address strobe signal RASX, an active-low column address strobe signal CASX, an active-low output enable signal OEX, and an active-low write enable signal WEX) fed from the outside of the memory device, and controls the data compression circuit 17 to output the logic judgement result based on the comparison result. Examples of the constitution of the output control circuit 18 will be described later.

Also, reference 19 denotes an output buffer circuit, which effects a buffering of data read from the memory cell array 10 in the normal mode and outputs the data to the outside of the memory device. Also, in the test mode, the output buffer circuit 19 outputs the logic judgement result compressed by the data compression circuit 17 to the outside of the memory device.

Figure 2:
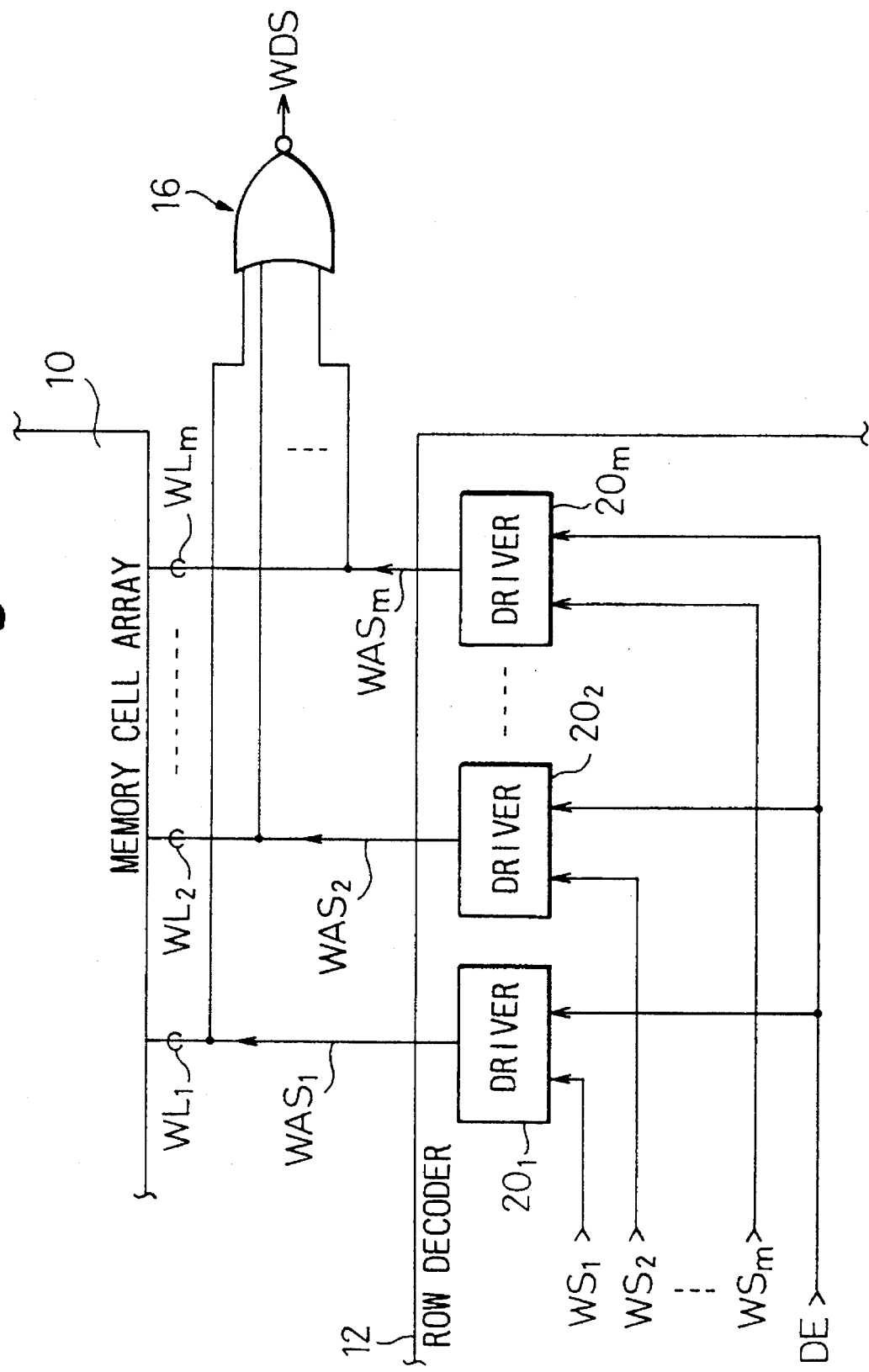
FIG. 2 is a diagram showing a circuit constitution of the level detection circuit and its related portion shown in FIG. 1.

FIG. 2 illustrates a circuit constitution of the level detection circuit 16 and its related portion.

As illustrated, the level detection circuit is constituted by a NOR gate 16 which is responsive to each logic level of the word line activation signals $WAS_1$ to WASm generated by the row decoder 12, corresponding to the word lines $WL_1$ to WLm, and thereby generates the word line detection signal WDS. Also, the word line activation signals $WAS_1$ to WASm are generated by drivers $20_1$ to 20m provided within the row decoder 12, corresponding to the word lines $WL_1$ to WLm, respectively. The drivers $20_1$ to 20m are activated by a driver enable signal DE, and output word line selection signals $WS_1$ to WSm, which are obtained by decoding the row address signal, as the word line activation signals $WAS_1$ to WASm, respectively.

In the constitution, where the word line activation signals $WAS_1$ to WASm are not output from the row decoder 12, i.e., where all of the word line activation signals $WAS_1$ to WASm are at "L" level, the output of the NOR gate 16 is brought to "H" level. Namely, the word line detection signal WDS is activated.

Figure 3:
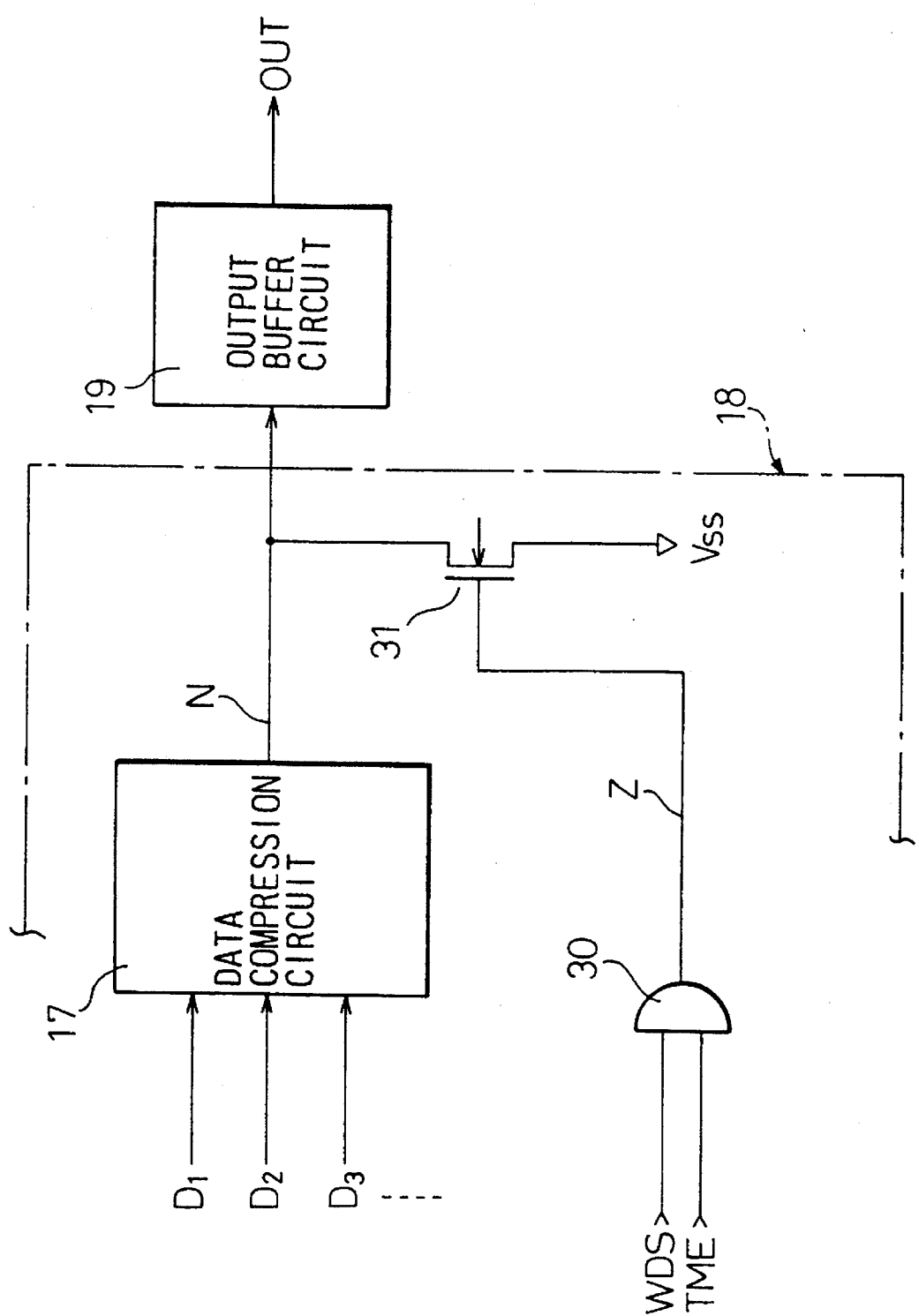
FIG. 3 is a circuit diagram showing a constitution of the output control circuit according to a first embodiment of the present invention.

FIG. 3 illustrates a constitution of the output control circuit 18 according to the first embodiment of the present invention.

The output control circuit 18 according to the present embodiment includes an AND gate 30 responsive to the word line detection signal WDS and the test mode activation signal TME, and an n-channel transistor 31 connected between an output end (node N) of the data compression circuit 17 and a lower potential power supply line Vss and responsive to a detection output Z of the AND gate 30. Also, the data compression circuit 17 carries out a comparison between each data bit $D_1, D_2, D_3, \ldots$, read from the memory cell array 10 in the test mode, and compresses a result of the comparison to thereby output a signal indicating the logic judgement result at node N. When the respective data bits $D_1, D_2, D_3, \ldots$, coincide with each other (i.e., when each data bit is at the same logic level), the logic judgement result signal exhibits "H" level, and when the respective data bits do not coincide with each other, the logic judgement result signal exhibits "L" level.

In the illustrated constitution, when both of the word line detection signal WDS and the test mode activation signal TME are activated to be "H" level, the detection output Z of the AND gate 30 is activated to be "H" level. The transistor 31 is turned ON in response to the activated detection output Z, and thus the potential at the output end (node N) of the data compression circuit 17 is pulled down to a level of Vss ("L" level).

Thus, when the word line activation signals $WAS_1$ to WASm are not output from the row decoder 12, i.e., when the word line detection signal WDS is activated, the logic judgement result signal of the data compression circuit 17 is controlled to indicate non-coincidence (i.e., "L" level) of each data bit $D_1, D_2, D_3, \ldots$, in place of indicating coincidence (i.e., "H" level) thereof. Then the controlled logic judgement result, i.e., the "L" level signal, is output via the output buffer circuit 19 to the outside of the memory device. Accordingly, based on the output "L" level signal, it is possible to carry out a correct logic judgement for recognizing that the memory cannot carry out a normal operation.

Figure 4:
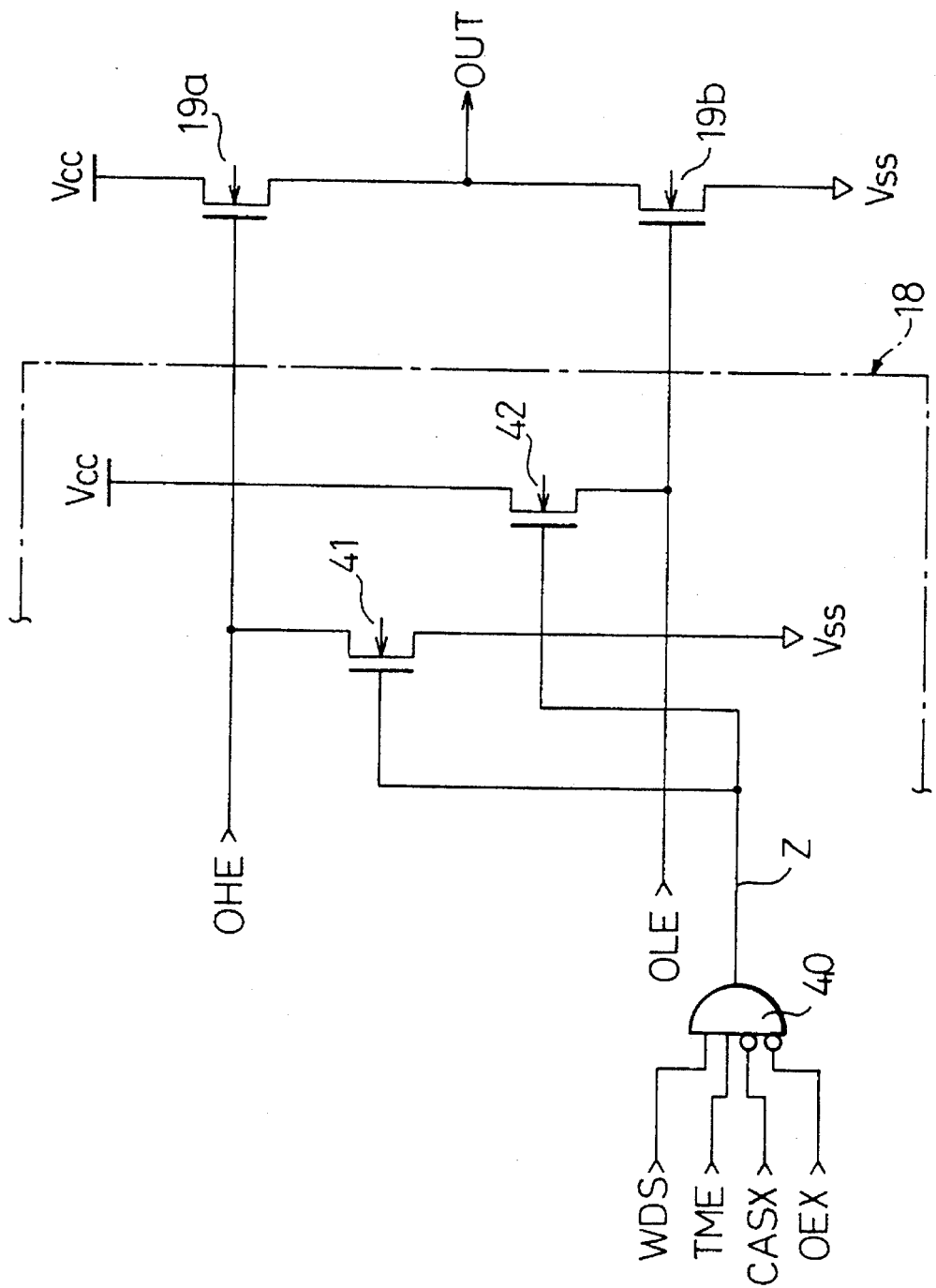
FIG. 4 is a circuit diagram showing a constitution of the output control circuit according to a second embodiment of the present invention.

FIG. 4 illustrates a constitution of the output control circuit 18 according to the second embodiment of the present invention.

The output control circuit 18 according to the present embodiment includes: an AND gate 40 responsive to the word line detection signal WDS, the test mode activation signal TME, the column address strobe signal CASX (inverted input) and the output enable signal OEX (inverted input); an n-channel transistor 41 connected between a line of a signal OHE and a lower potential power supply line Vss and responsive to a detection output Z of the AND gate 40; and an n-channel transistor 42 connected between a higher potential power supply line Vcc and a line of a signal OLE and responsive to the detection output Z of the AND gate 40. The signals OHE and OLE have logic levels indicating the logic judgement result of the data compression circuit 17 (signal at node N shown in FIG. 3). In the present embodiment, when the logic judgement result is at "H" level, the signals OHE and OLE exhibit "H" level and "L" level, respectively.

Also, references 19a and 19b denote n-channel transistors, each constituting an output gate, contained in the output buffer circuit 19. The transistors 19a and 19b are connected in series between the power supply line Vcc and the power supply line Vss, and are turned ON or OFF in response to the signals OHE and OLE, respectively. Accordingly, when the logic judgement result is at "H" level, only the output gate transistor 19a is turned ON and thus the output OUT exhibits a level of Vcc ("H" level).

In the illustrated constitution, when all of the word line detection signal WDS, the test mode activation signal TME, the column address strobe signal CASX and the output enable signal OEX are activated, the detection output Z of the AND gate 40 is activated to be at the "H" level. The transistors 41 and 42 respond to the activated detection output Z to thereby be turned ON, respectively. Accordingly, the level of the signal OHE is pulled down to a level of Vss ("L" level), while the level of the signal OLE is pulled up to a level of Vcc ("H" level). As a result, only the output gate transistor 19b is turned ON and thus the output OUT exhibits a level of Vss ("L" level).

Thus, when the word line detection signal WDS is activated, the signal OHE (or OLE) indicating the logic judgement result of the data compression circuit 17 is controlled to indicate non-coincidence of the read data, i.e., "L" level (or "H" level), in place of indicating coincidence thereof, i.e., "H" level (or "L" level). Then the controlled logic judgement result is output to the outside of the memory device based on ON/OFF operations of the output gate transistors 19a and 19b. Thus, it is possible to carry out a correct logic judgement.

Figure 5:
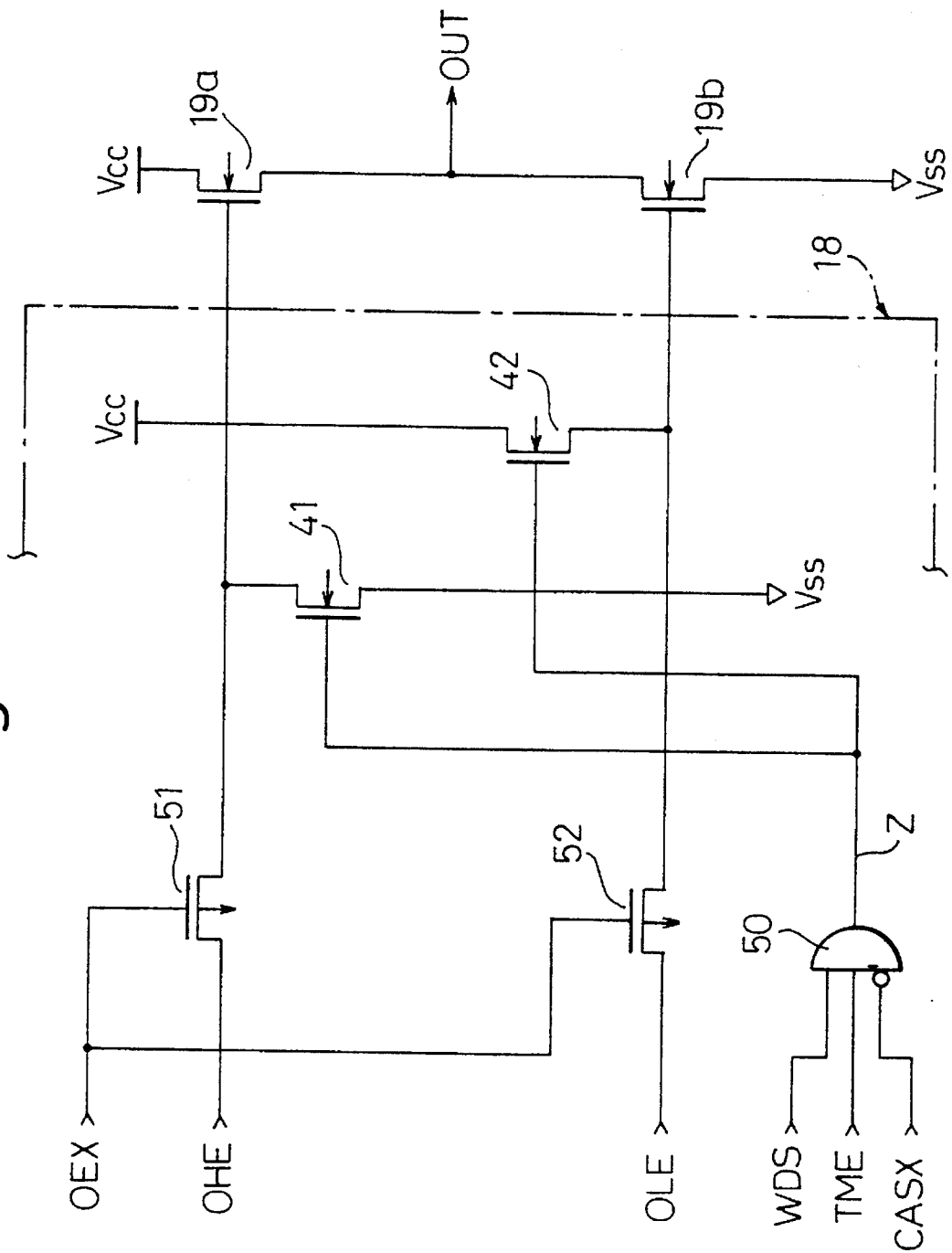
FIG. 5 is a circuit diagram showing a constitution of the output control circuit according to a third embodiment of the present invention.

FIG. 5 illustrates a constitution of the output control circuit 18 according to the third embodiment of the present invention.

The illustrated circuit constitution is different from the circuit constitution of the second embodiment (see FIG. 4) in that there is provided an AND gate 50 responsive to the word line detection signal WDS, the test mode activation signal TME and the column address strobe signal CASX (inverted input), and in that there are provided two p-channel transistors 51 and 52 responsive to the output enable signal OEX, for carrying out output control of the signals OHE and OLE indicating the logic judgement result, respectively. Other circuit portions and their modes of operation are the same as those in the second embodiment, and thus the explanation thereof is omitted.

Although, in the second embodiment, the output enable signal OEX is used to activate the detection output Z of the AND gate 40, the present embodiment uses the output enable signal OEX for the purpose of carrying out output control of the signals OHE and OLE indicating the logic judgement result. Namely, the present embodiment is different from the second embodiment only in the manner of use of the output enable signal OEX. With respect to the important feature (i.e., the logic judgement result of the data compression circuit 17 is controlled to indicate non-coincidence based on activation of the word line detection signal WDS), the present embodiment is the same as the second embodiment, and thus can produce the same effects as in the second embodiment.

Figure 6:
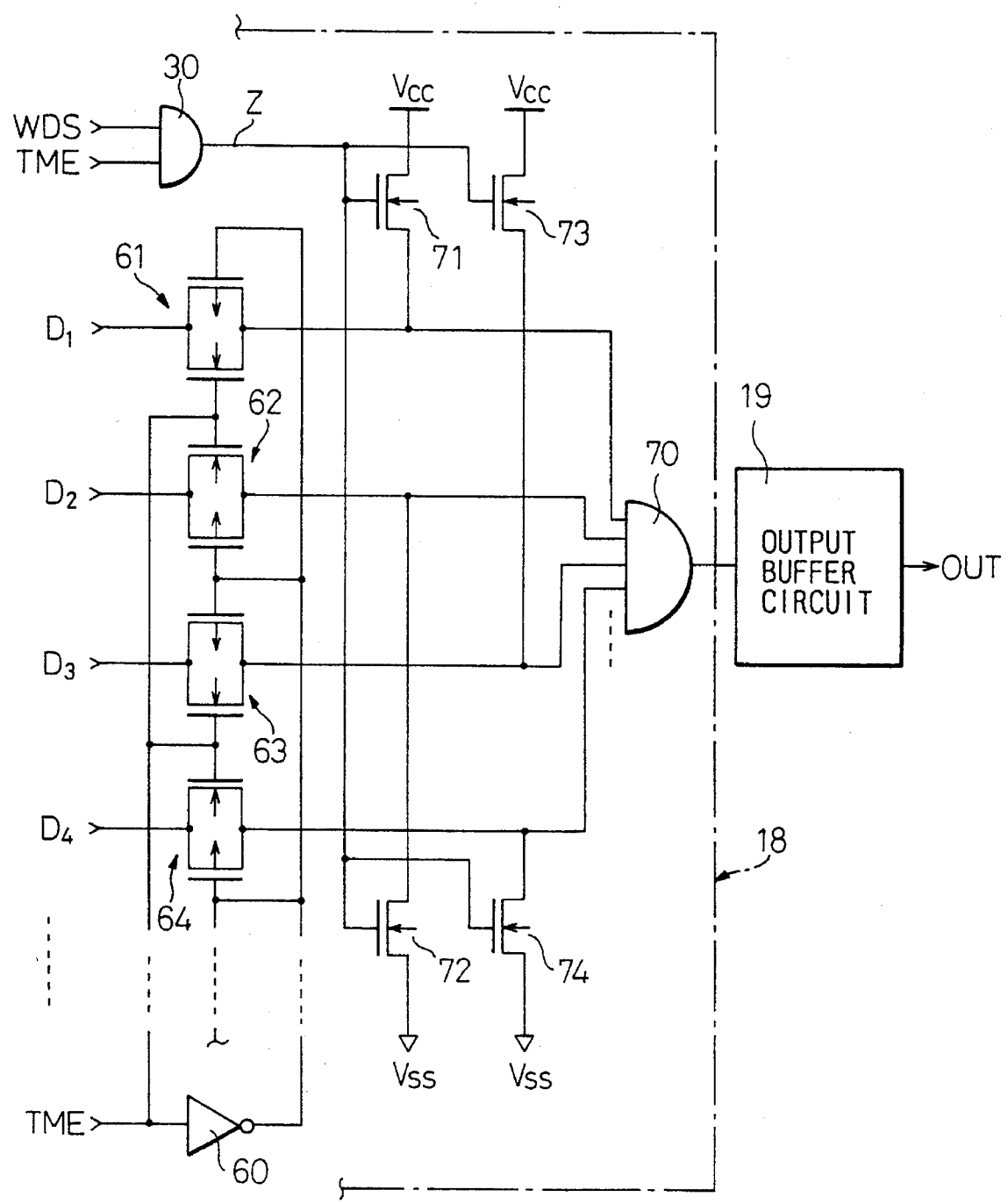
FIG. 6 is a circuit diagram showing a constitution of the output control circuit according to a fourth embodiment of the present invention.

FIG. 6 illustrates a constitution of the output control circuit 18 according to the fourth embodiment of the present invention.

The output control circuit 18 according to the present embodiment includes: an AND gate 30 responsive to the word line detection signal WDS and the test mode activation signal TME; an inverter 60 responsive to the test mode activation signal TME; transmission gates 61, 62, 63, 64, . . . , each responsive to the test mode activation signal TME and its inverted signal, for carrying out output controls of read data $D_1$, $D_2$, $D_3$, $D_4$, . . . , to be compared and compressed, respectively; n-channel transistors 71 and 73 connected between a higher potential power supply line Vcc and output-side lines of the transmission gates 61 and 63, respectively, and responsive to a detection output Z of the AND gate 30; n-channel transistors 72 and 74 connected between a lower potential power supply line Vss and output-side lines of the transmission gates 62 and 64, respectively, and responsive to the detection output Z of the AND gate 30; and an AND gate 70 responsive to the read data $D_1$, $D_2$, $D_3$, $D_4$, . . . , output through the transmission gates 61, 62, 63, 64, . . . , respectively. The AND gate 70 corresponds to the data compression circuit 17. Also, each transmission gate is constituted by an n-channel transistor and a p-channel transistor connected in parallel to each other. In the present embodiment, the n-channel transistor is responsive to the test mode activation signal TME and the p-channel transistor is responsive to the output of the inverter 60.

Although, in each of the first to third embodiments shown in FIGS. 3 to 5, the output control circuit 18 changes a logic level of the data which is obtained by comparing and compressing each bit data read from the memory cell array, the output control circuit 18 according to the present embodiment changes logic levels of each bit data read from the memory cell array, and then compares and compresses the changed data.

Namely, in the circuit constitution of the fourth embodiment, when both of the word line detection signal WDS and the test mode activation signal TME are activated to be "H" level, the detection output Z of the AND gate 30 is activated to be "H" level. The transistors 71 to 74 respond to the activated detection output Z to thereby be turned ON, respectively. As a result, regardless of each logic level of the read data $D_1$, $D_2$, $D_3$ and $D_4$, the potentials at the output-side lines of the transmission gates 61, 62, 63 and 64 are brought to "H" level, "L" level, "H" level and "L" level, respectively. Accordingly, the AND gate 70 (i.e., the data compression circuit) detects non-coincidence of its input data.

Thus, when the word line detection signal WDS is activated, the AND gate 70 controls its output to indicate non-coincidence (i.e., "L" level) of the read data $D_1$, $D_2$, $D_3$, $D_4$, . . . . Then the controlled output (i.e., logic judgement result) is output via the output buffer circuit 19 to the outside of the memory device. Accordingly, based on the output "L" level signal, it is possible to carry out a correct logic judgement for recognizing that the memory cannot carry out a normal operation.

Although, in the fourth embodiment, the four transistors 71 to 74 are provided so as to control the read data which are to be compared and compressed, the number of transistors to be provided is not restricted to four. The important thing is that, when the read data $D_1$, $D_2$, $D_3$, $D_4$, . . . , coincide with each other where the word line detection signal WDS is activated, the AND gate 70 controls its output to indicate non-coincidence of the read data $D_1$, $D_2$, $D_3$, $D_4$, . . . .

Although the present invention has been disclosed and described by way of four embodiments, it is apparent to those skilled in the art that other embodiments and modifications of the present invention are possible without departing from the essential features thereof.

What is claimed is:

1. A semiconductor memory device comprising:

a memory cell array having a plurality of word lines;

a decoder circuit for decoding an address signal to thereby generate a word line activation signal for driving a corresponding one of said plurality of word lines;

a data compression circuit for carrying out a comparison between each data bit, read from said memory cell array in a test mode, of a plurality of memory cells connected to a common word line, and compressing a result of the comparison to thereby output a logic judgement result; and an output control circuit responsive to an external test mode activation signal and the word line activation signal from said decoder circuit, for controlling said data compression circuit, wherein, in the event the logic judgement result indicates coincidence when said word line activation signal is not output from said decoder circuit, said output control circuit controls the logic judgement result of said data compression circuit to indicate non-coincidence.

2. The semiconductor memory device as set forth in claim 1, further comprising a level detection circuit for detecting each logic level of a plurality of word line activation signals generated by said decoder circuit, corresponding to said plurality of word lines, and thereby generating a word line detection signal, said level detection circuit activating the word line detection signal when said plurality of word line activation signals are not output from said decoder circuit.

3. The semiconductor memory device as set forth in claim 2, wherein said output control circuit comprises a logic gate responsive to said word line detection signal and said test mode activation signal, and a circuit responsive to a detection output of said logic gate, for fixing a logic level of the logic judgement result of said data compression circuit to a predetermined level, said predetermined level corresponding to a logic level indicating non-coincidence of said logic judgement result.

4. The semiconductor memory device as set forth in claim 3, wherein said circuit for fixing a logic level of the logic judgement result includes a transistor responsive to the detection output of said logic gate.

5. The semiconductor memory device as set forth in claim 2, wherein said output control circuit comprises a logic gate responsive to said word line detection signal, said test mode activation signal, a column address strobe signal and an output enable signal, and a circuit responsive to a detection output of said logic gate, for fixing a logic level of a signal indicating the logic judgement result of said data compression circuit to a predetermined level, said predetermined level corresponding to a logic level indicating non-coincidence of said logic judgement result.

6. The semiconductor memory device as set forth in claim 5, wherein said circuit for fixing a logic level of a signal indicating the logic judgement result includes at least one transistor responsive to the detection output of said logic gate.

7. The semiconductor memory device as set forth in claim 2, wherein said output control circuit comprises a logic gate responsive to said word line detection signal, said test mode activation signal and a column address strobe signal, a first circuit responsive to an output enable signal, for carrying out an output control of a signal indicating the logic judgement result of said data compression circuit, and a second circuit responsive to a detection output of said logic gate, for fixing a logic level of the signal indicating said logic judgement result output through said first circuit, to a predetermined level, said predetermined level corresponding to a logic level indicating non-coincidence of said logic judgement result.

8. The semiconductor memory device as set forth in claim 7, wherein said second circuit includes at least one transistor responsive to the detection output of said logic gate.

9. The semiconductor memory device as set forth in claim 7, wherein said first circuit includes at least one transistor responsive to said output enable signal.

10. The semiconductor memory device as set forth in claim 2, wherein said output control circuit comprises a logic gate responsive to said word line detection signal and said test mode activation signal, and a circuit responsive to a detection output of said logic gate, for fixing respective logic levels of each bit data, which are read from said memory cell array and are to be compared and compressed, to a predetermined level, said predetermined level corresponding to a logic level indicating non-coincidence of said logic judgement result.

11. The semiconductor memory device as set forth in claim 10, wherein said circuit for fixing said respective logic levels of each said bit data includes at least one transistor responsive to the detection output of said logic gate.

* * * * *